United States Patent
Baeuerlein et al.

(10) Patent No.: US 6,861,842 B2
(45) Date of Patent: Mar. 1, 2005

(54) METHOD FOR DETERMINING THE AMOUNT OF CHARGE WHICH CAN STILL BE DRAWN FROM AN ENERGY STORAGE BATTERY, AND AN ENERGY STORAGE BATTERY

(75) Inventors: Peter Baeuerlein, Lindwedel (DE); Frank Helkmer, Hannover (DE); Eberhard Meissner, Wunstorf (DE); Ingo Koch, Hameln (DE)

(73) Assignee: VB Autobatterie GmbH (DE)

( * ) Notice: Subject to any disclaimer, the term of this patent is extended or adjusted under 35 U.S.C. 154(b) by 32 days.

(21) Appl. No.: 10/620,525

(22) Filed: Jul. 16, 2003

(65) Prior Publication Data

US 2004/0130297 A1 Jul. 8, 2004

(30) Foreign Application Priority Data

Jul. 17, 2002 (DE) ......................................... 102 32 251

(51) Int. Cl.⁷ ............................................ G01N 27/416
(52) U.S. Cl. ..................................................... 324/426
(58) Field of Search .......................... 324/426, 427–433

(56) References Cited

U.S. PATENT DOCUMENTS

| | | | |
|---|---|---|---|
| 5,140,269 A | * | 8/1992 | Champlin ................... 324/433 |
| 5,485,090 A | * | 1/1996 | Stephens .................... 324/433 |
| 5,572,136 A | | 11/1996 | Champlin .................... 324/426 |
| 5,680,050 A | | 10/1997 | Kawai et al. ................ 324/427 |
| 5,721,688 A | | 2/1998 | Bramwell .................... 202/63 |
| 5,898,292 A | | 4/1999 | Takemoto et al. ........... 320/136 |

FOREIGN PATENT DOCUMENTS

| | | |
|---|---|---|
| DE | 69131276 T2 | 3/1992 |
| DE | 9321638 U1 | 8/2001 |
| EP | 0432689 B1 | 6/1991 |

* cited by examiner

Primary Examiner—Pia Tibbits
(74) Attorney, Agent, or Firm—Foley & Lardner LLP

(57) ABSTRACT

A method for determining the amount of charge which can still be drawn from an energy storage battery includes measuring current values and voltage values at at least two times in a voltage response of the energy storage battery to at least one current pulse, with one voltage/current value pair being obtained for each of the at least two times. The method also includes calculating a resistance difference characteristic variable utilizing the measured voltage/current value pairs. The method also includes determining of the amount of charge which can still be drawn from the energy storage battery utilizing the resistance difference characteristic variable. An energy storage battery having measurement means and processor-controlled evaluation means may be provided for carrying out the method.

46 Claims, 3 Drawing Sheets

METHOD FOR DETERMINING THE AMOUNT OF CHARGE WHICH CAN STILL BE DRAWN FROM AN ENERGY STORAGE BATTERY, AND AN ENERGY STORAGE BATTERY

CROSS-REFERENCE TO RELATED PATENT APPLICATIONS

Germany Priority Application DE 102 32 251.1-34, filed Jul. 17, 2002 including the specification, drawings, claims and abstract, is incorporated herein by reference in its entirety.

BACKGROUND OF THE INVENTION

The present invention relates to a method for determining the amount of charge which can still be drawn from an energy storage battery and to an energy storage battery having measurement means and processor-controlled evaluation means for carrying out the method.

Wear occurs as the result of the use of rechargeable energy storage batteries, in particular while they are being discharged and charged. In addition, other operating conditions also exist which accelerate the wear of electrochemical energy stores. For example, in the case of a lead-acid rechargeable battery, these include the total operating time, that is to say the total time which has passed since they were brought into use, including those periods in which the rechargeable battery was not subject to any electrical load. This wear is further exacerbated by increased temperatures. Increased temperatures may, however, not only accelerate the wear during periods when no electrical load is applied, but may also increase the wear caused by cyclic discharging and charging.

For an energy storage battery, the wear becomes evident inter alia from a decrease in the storage capacity for electrical charge, so that the amount of charge which can be drawn cannot simply be determined on the basis of the full state of charge.

The amount of charge $Q_{Rest}$ which can be drawn from the energy storage battery is in this case that amount of charge which can still be drawn in nominal conditions starting from the present state of the energy storage battery. When the energy storage battery is new, the sum of the amount of charge which can be drawn and the amount of charge which is being discharged is the storage capacity when new. The storage capacity when new is the actual storage capacity of a new, unused energy store.

The amount of charge which has been discharged is that amount of charge which must be drawn in nominal conditions in order to reach the present state of charge, starting from an energy storage battery in the fully charged state.

The amount of charge, expressed in ampere hours (Ah), which can be drawn in nominal conditions from a correctly fully charged energy store is defined as the present storage capacity. This parameter generally varies with a falling trend as the usage duration increases.

The nominal value of the storage capacity as specified by the manufacturer of the energy storage battery is defined as the nominal storage capacity. The reduction in the storage capacity is understood to be the difference between the present storage capacity and the storage capacity when new.

U.S. Pat. No. 5,721,688 discloses an apparatus and a method for measuring electrical characteristic variables of a power supply system using a voltage measurement apparatus, a controllable current source or current sink, and a microcomputer. The microcomputer is used to control the current source or current sink such that at least one specific current profile is applied to the power supply system. The voltage measurement device is then used to measure the voltage response to the current profile and to determine an electrical characteristic variable from this, with one of the characteristic variables being at least the internal resistance of the power supply system. The internal resistance is determined from the voltage difference between the voltage drop across the resistor in test conditions and the voltage drop when a test current is superimposed on the current that flows in the operating state.

U.S. Pat. No. 5,572,136 discloses an electronic apparatus for testing energy storage batteries, by means of which a relatively small current which varies with time is applied to an energy storage battery, and the time-dependent voltage response of the energy storage battery is observed. A microprocessor is used to determine the conductivity of the energy storage battery from the voltage response. Furthermore, the observed voltage response level can be compared with a reference value in order to derive an assessment of the quality of the energy storage battery. In this case, the profile of the voltage response is recorded and is evaluated. This is relatively complex and leads to inaccuracies in the derivation of a comparable characteristic variable.

DE 93 21 638 U1 discloses an electronic battery tester for testing an electrochemical energy storage battery, which has a dynamic parameter (conductance or resistance). The battery tester has means for measuring this dynamic parameter. Furthermore, the no-load voltage is measured, and the measured dynamic parameter value is corrected for the state of charge by matching it to the no-load voltage.

U.S. Pat. No. 5,680,050 discloses a method for identification of the battery state, in which a correction value is determined on the basis of an average discharge current for a time period which is longer than that time period which results in the discharge polarization assuming a steady state. The capacity of the energy storage battery in the fully charged state is multiplied by the correction value, and the energy consumption of the battery is subtracted from the available discharge capacity in order to determine the available reserve capacity.

The methods and apparatuses described above are used for determining present electrical characteristic variables of an energy storage battery in terms of the conductance and/or internal resistance. The methods also in some cases make it possible to determine the discharge capacities which can be drawn from an energy storage battery as a function of the charging current. However, the capacity of the fully charged energy storage battery must be known in order to do this.

Furthermore, DE 691 31 276 T2 discloses an electronic tester for assessing the percentage energy capacity of an energy storage battery or of a battery cell. In this case, the dynamic conductance is determined and is compared with a reference conductance, which corresponds to the conductance of a cell or energy storage battery with a capacity of 100%. However, this method does not allow the total capacity of a fully charged energy storage battery to be established, and does not make it possible to determine whether any capacity change has occurred due to aging of the energy storage battery or due to discharging during operation. Furthermore, no information about the wear state of the energy storage battery can be obtained from the time response of the measured values over a lengthy time period. The dynamic conductance is useful only to a limited extent as a measure for battery wear.

There is thus a need to provide an improved method for determining the amount of charge $Q_{Rest}$ which can still be drawn from an energy storage battery when this energy storage battery is no longer new. There is also a need to provide an energy storage battery having measurement means and processor-controlled evaluation means for carrying out the method.

SUMMARY OF THE INVENTION

An exemplary embodiment relates to a method for determining the amount of charge which can still be drawn from an energy storage battery. The method includes measuring current values and voltage values at at least two times in a voltage response of the energy storage battery to at least one current pulse, with one voltage/current value pair being obtained for each of the at least two times. The method also includes calculating a resistance difference characteristic variable utilizing the measured voltage/current value pairs. The method also includes determining of the amount of charge which can still be drawn from the energy storage battery utilizing the resistance difference characteristic variable.

Another exemplary embodiment relates to an energy storage battery having measurement means and processor-controlled evaluation means configured to carry out a method. The method includes a step of measuring current values and voltage values at at least two times in a voltage response of the energy storage battery to at least one current pulse, with one voltage/current value pair being obtained for each of the at least two times. The method also includes the step of calculating a resistance difference characteristic variable utilizing the measured voltage/current value pairs. The method also includes the step of determining of the amount of charge which can still be drawn from the energy storage battery utilizing the resistance difference characteristic variable.

BRIEF DESCRIPTION OF THE DRAWINGS

The invention will be explained in more detail in the following text with reference to the attached drawings, in which.

DETAILED DESCRIPTION OF THE PREFERRED EMBODIMENTS

Figure 1:
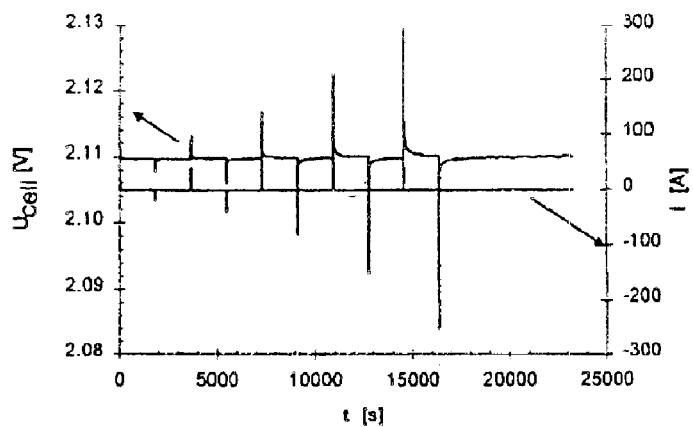
FIG. 1 shows a diagram of a pulsed current profile with a voltage response for determining the amount of charge which can be drawn.

According to the present invention, a method of determining the amount of charge which can be drawn from an energy storage battery includes measuring current values $I_i$ and voltage values $U_i$ at at least two times $t_1$ in a voltage response of the energy storage battery to one or more direct-current pulses, with one voltage/current value pair being obtained for each time $t_i$; calculating a resistance difference characteristic variable RD from the measured voltage/current value pairs; and determining of the amount of charge $Q_{Rest}$ which can still be drawn from the energy storage battery from the resistance difference characteristic variable RD. The method is particularly suitable for lead-acid rechargeable batteries as the energy storage batteries.

In contrast to known methods, the present invention proposes that the amount of charge which can still be drawn from an energy storage battery be calculated from a resistance difference characteristic variable on the basis of a voltage response to at least one direct-current pulse, rather than from the internal resistance as described, by way of example, in U.S. Pat. No. 5,721,688.

In addition, the resistance difference characteristic variable is not determined on the basis of a dynamic conductance, but from the evaluation of the time profile of the voltage response, for which purpose only characteristic points of the voltage response, rather than the entire profile, need be evaluated.

It is possible to obtain information about the storage capacity of the energy storage battery, and hence about the amount of charge which can still be drawn, in a simple manner by using direct-current pulses to apply a small converted charge.

The voltage/current value pairs which are used for calculating the resistance difference characteristic variable RD are preferably recorded at at least one first time $t_1$, which occurs during the rest phase of the energy storage battery, and at at least one later time $t_2$ in the phase of the voltage response which is characterized by polarization of the energy storage battery. It has been found that a resistance difference characteristic variable RD which is a measure of the amount of charge that can still be drawn can be determined by relating the voltage/current value pairs in these two phases, the rest phase and the polarization phase.

In this case, the first time $t_1$ preferably occurs immediately before a current pulse of a front current pulse flank, and the second time $t_2$ occurs after a front current pulse flank of the decaying current pulse.

The resistance difference characteristic variable RD is preferably calculated using the following steps: (1) formation of the current differences $\Delta I_{i,j}$ between in each case two current values and of the voltage differences $\Delta U_{i,j}$ of in each case two voltage values; (2) calculation of a set of difference quotients, in each case as the quotient of a voltage difference and of the associated current difference; and (3) formation of the resistance difference characteristic variable RD from the set of difference quotients.

The amount of charge which can be drawn is thus preferably obtained not only from a difference quotient but also from a large number of difference quotients which, for example, are converted to the resistance difference characteristic variable RD by forming the mean value of the set of difference quotients. The averaging process may, for example, by carried out linearly.

The reduction in the storage capacity of the energy storage battery can also advantageously be derived from the resistance difference characteristic variable RD.

The resistance difference characteristic variable RD is preferably determined only from those voltage/current value pairs which were measured with comparable states of charge and/or comparable temperatures of the energy storage battery.

The amount of charge which can still be drawn from the energy storage battery is preferably determined by means of a predetermined function or a stored value table, which define the relationship between the amounts of charge and the resistance difference characteristic variables. In this case, the temperature of the energy storage battery is preferably also measured, with the amount of charge which can be drawn being determined as a function of the temperature. For this purpose, the difference quotients may, for example, be normalized with respect to a basic temperature.

It is also advantageous to determine the amount of charge which can be drawn as a function of a present degree of discharge DoD of the energy storage battery.

In technical limit conditions, which allow a current pulse in the charging direction, it is preferable to apply a sequence of current pulses to the energy storage battery, with the current direction changing alternately. If this is not possible, then the amount of charge which can still be drawn is preferably determined by means of one or more current pulses in the discharge direction.

The magnitude of the current values for the applied current pulse is preferably less than the 10-hour current of the energy storage battery being analyzed, but is preferably less than the 50-hour current and is even more preferably less than the 200-hour current of the energy storage battery.

Furthermore, a current change should occur between two measurements of two voltage/current value pairs, with the magnitude of this current change being greater than the 5000-hour value of the current of the energy storage battery, but preferably being greater than the 1000-hour value of the current, and preferably being greater than the 200-hour value of the current of the energy storage battery.

Furthermore, the resistance difference characteristic variable RD is preferably calculated using only those voltage/current value pairs whose first voltage/current value pair was measured at most 10 seconds, but preferably at most 1 second and particularly at most 0.1 second immediately before a current change in the applied current pulse.

It is also advantageous for the resistance difference characteristic variable RD to be calculated using only those voltage/current value pairs for forming the difference quotients whose second voltage/current value pair was not measured until the time integral of the current flowing, starting from the time of the current change $\Delta I$ after the measurement of the first voltage/current value pair to the time of the measurement of the second voltage/current value pair, has a value of at least 0.01 mAs, preferably of 0.1 mAs and particularly preferably of only 1 mAs for each ampere hour Ah of storage capacity of the energy storage battery. The values of the time integral are preferably chosen as a function of the temperature of the energy storage battery such that higher values of the time integral are defined for higher temperatures, and lower values of the time integral are defined for lower temperatures.

The current profile on which the voltage responses for calculating a resistance difference characteristic variable RD are based should be approximately comparable. In particular, the current rates of change of the current change between all the voltage/current value pairs used, the time durations between the first voltage/current value pair and the current change, and the time periods between the current change and the respective second voltage/current value pair should be approximately the same.

The current profile is in this case applied (actively or passively) to the energy storage battery by means of an electrical switching unit.

It is also advantageous to compare the resistance difference characteristic variable RD or the amount of charge $Q_{Rest}$ which can be drawn with a threshold value, and to indicate the overshooting of the threshold value, the ratio to the threshold value or the discrepancy from the threshold value. The threshold value may in this case be chosen, for example, as a function of the temperature of the energy store.

It is also advantageous to link the calculated amount of charge $Q_{Rest}$ which can be drawn with determination of the present degree of discharge DoD or of the present state of charge SoC of the energy storage battery, and to determine the total present storage capacity of the storage battery from this linking process. This present storage capacity may be indicated or may be used for further evaluation.

Furthermore, the calculated amount of charge $Q_{Rest}$ which can be drawn is linked with determination of the present degree of discharge DoD or of the present, stage of charge SoC in order to determine the amount of charge with which the energy store can be charged, and which can likewise be indicated or used for further evaluation.

The total present storage capacity may additionally be linked to the storage capacity when new or to the nominal value of the storage capacity in order to determine from this a wear characteristic variable which expresses the reduction in the storage capacity of the energy storage battery. This wear characteristic variable can be indicated or used for further calculation. The wear characteristic variable is preferably compared with a threshold value, and information relating to the necessity for replacement or servicing of the energy store can be deduced from this comparison.

The described method can also be linked to other methods for determining the state of the energy storage battery, preferably to methods which determine the state of charge and/or the power capacity. It can likewise be linked to other methods for determining the wear of the energy storage battery, with the methods taking into account other effects which contribute to the wear of energy storage batteries.

Furthermore, in order to predict the states of the energy storage battery, it is advantageous to use the determined state values, in particular the amount of charge which can be drawn, to derive predictions relating to the behavior of the energy storage battery in an operating state other than the present operating state.

FIG. 1 shows a diagram of a pulsed current profile I(t) plotted against time t, with this current pulse being applied to an energy storage battery. The current profile I(t) comprises current pulses I with alternating current directions. The magnitude of the applied current I in this case increases for each current pulse.

Initially, the energy storage battery is in the rest state. The following current profile with 5 current pulse sequences A, B, C, D and E is then applied as follows, in order to determine the amount of charge $Q_{Rest}$ which can be drawn:
Current pulse A1: t=18 s, I=+20 mA;
Current pulse A2: t=1800 s, I=0 mA;

Current pulse A3: t=18 s, I=−20 mA;
Current pulse A4: t=1800 s, I=0 mA;
Current pulse B1: t=18 s, I=+40 mA;
Current pulse B2: t=1800 s, I=0 mA;
Current pulse B3: t=18 s, I=−40 mA;
Current pulse B4: t=1800 s, I=0 mA;
Current pulse C1: t=18 s, I=+80 mA;
Current pulse C2: t=1800 s, I=0 mA;
Current pulse C3: t=18 s, I=−80 mA;
Current pulse C4: t=1800 s, I=0 mA;
Current pulse D1: t=18 s, I=+150 mA;
Current pulse D2: t=1800 s, I=0 mA;
Current pulse D3: t=18 s, I=−150 mA;
Current pulse D4: t=1800 s, I=0 mA;
Current pulse E1: t=18 s, I=+250 mA;
Current pulse E2: t=1800 s, I=0 mA;
Current pulse E3: t=18 s, I=−250 mA;
Current pulse E4: t=1800 s, I=0 mA.

The applied currents I each result in a voltage response which is characterized by a pronounced sudden voltage change ΔU and a subsequent decay phase.

Figure 2:
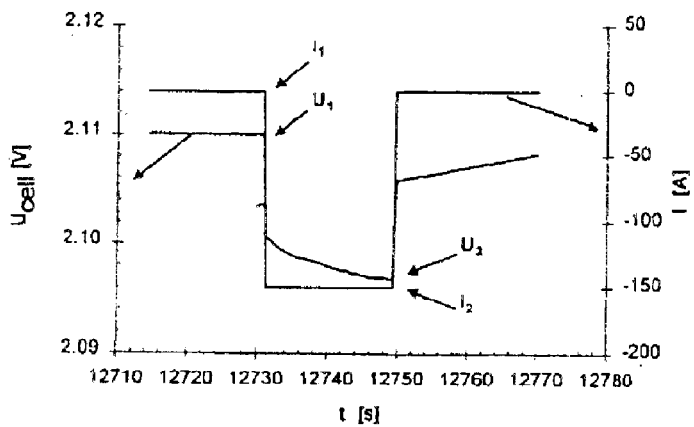
FIG. 2 shows a diagram with a chosen current pulse and a voltage response with the current and voltage values that are used for calculating a difference quotient.

FIG. 2 shows a detail from the diagram shown in FIG. 1, in this case with the phase with the steep voltage and current rise at the time around approximately t=12,730 s to about 12,732 s being governed by the resistance of the energy storage battery. Further polarization effects still have no effect there. The subsequent voltage response phase is, on the other hand, governed by the polarization effects of the energy storage battery, in which the voltage pulse U decays (negative current pulse) or rises (positive voltage pulse) more slowly. At least two voltage/current value pairs $U_i$, $I_i$ are determined from the current and voltage curve, with a first time $t_1$ (~12,730 s) occurring immediately before the rising flank of the voltage response or of the current pulse. A second time $t_2$ (~12,748 s) occurs approximately at the end of the current pulse, that is to say shortly before the falling current or voltage flank. A, difference voltage and a difference current are calculated from the two voltage/current value pairs $U_i$, $I_i$ relating to the times $t_1$ and $t_2$, using the following formula:

$$\Delta U = (U_i - U_j) = (U_1 - U_2)$$

$$\Delta I = (I_i - I_j) = (I_1 - I_2)$$

The resistance difference characteristic variable is calculated from the formula $$RD = \frac{\Delta U}{\Delta I}$$

and utilizes the difference voltage ΔU and the difference current ΔI.

This resistance difference characteristic variable RD is a characteristic variable for an energy storage battery and depends on the present amount of charge $Q_{Rest}$ which can still be drawn from the energy storage battery. It has been found that the resistance difference characteristic variable RD increases considerably when the amount of charge $Q_{Rest}$ which can still be drawn from the energy storage battery at any given time is below a specific threshold value. The rise in the resistance difference characteristic variable RD can then be used for further evaluation and/or for initiating an action.

The following text describes an investigation into different lead-acid rechargeable batteries, which have a positive plate and two negative plates. In this case, positive plates were investigated that had been subjected to different prior treatments which lead to a reduction in the storage capacity of the respective positive plate.

| Cell No. | Capacity in Ah | Prior treatment |
| --- | --- | --- |
| 2 | 13.70 | None (new cell) |
| 4 | 7.13 | Cycles with 50% discharge depth |
| 7 | 4.90 | Cycles with 17.5% discharge depth |

The tests are described in: "Lastenheft für PKW-Starterbatterien" [Specification for passenger vehicle starter batteries] from the Verband der deutschen Automobilindustrie (VDA) [Society of the German Automobile Industry], revised on Jan. 12, 1997.

If the amount of charge $Q_{Rest}$ which can be drawn is less than 4 Ah, the positive electrodes investigated have a very similar resistance difference characteristic variable RD, which depends only slightly on the aging state of the positive electrode investigated, and which can thus be used for determining the amount of charge $Q_{Rest}$ which can still be drawn from the positive electrode.

The resistance difference characteristic variable RD is approximately 70 milliohms (mΩ) when the amount of charge $Q_{Rest}$ which can be drawn is approximately 3 Ah. For a new positive electrode (cell 2), it is approximately 74 mΩ, for a positive electrode (cell 4) which has been subjected to 120 cycles it is approximately 77 mΩ, and for a positive electrode (cell 7) which has been aged in accordance with AK 3.4 it is approximately 78 mΩ.

Figure 3:
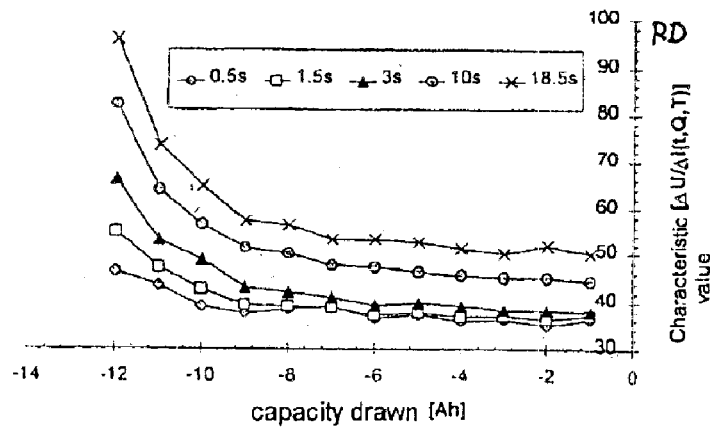
FIG. 3 shows a diagram of the resistance difference characteristic variable RD plotted against the capacity drawn from a new energy storage battery for different pulse durations.

FIG. 3 shows the relationship between the resistance difference characteristic variable RD and the capacity of a new positive electrode as a function of the pulse duration. In this case, the voltage value U at different times after the current pulse I has been switched on is used to determine the resistance difference characteristic variable RD, rather than the voltage value $U_2$ at the end of the current pulse. This clearly shows that the resistance difference characteristic variable RD thus also depends on the pulse duration t. The resistance difference characteristic variable RD thus rises to a greater extent as the pulse duration becomes longer.

Figure 4:
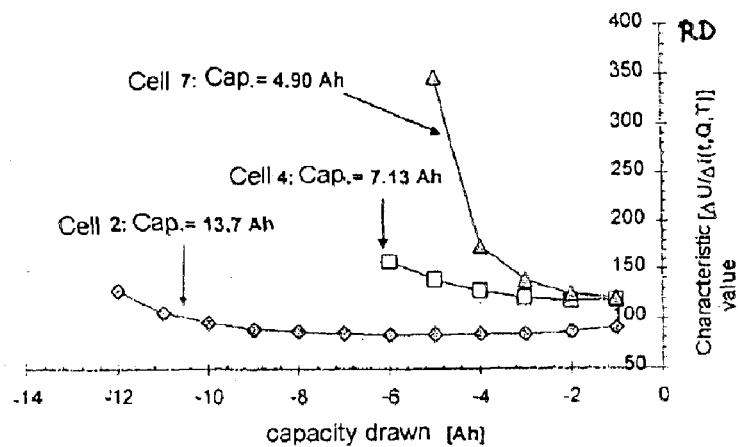
FIG. 4 shows a diagram of resistance difference characteristic variables RD plotted against the capacity drawn for energy storage batteries of different capacities, on the basis of different degrees of aging.

FIG. 4 shows the relationship between the resistance difference characteristic variable RD and the capacity drawn from a new positive electrode. Once again, a clear rise in the resistance difference characteristic variable RD can be seen towards the end of the discharge. However, the cell in the energy storage battery with a new positive electrode has a considerably lower resistance difference characteristic variable RD overall than the cells with an aged positive electrode.

Figure 5:
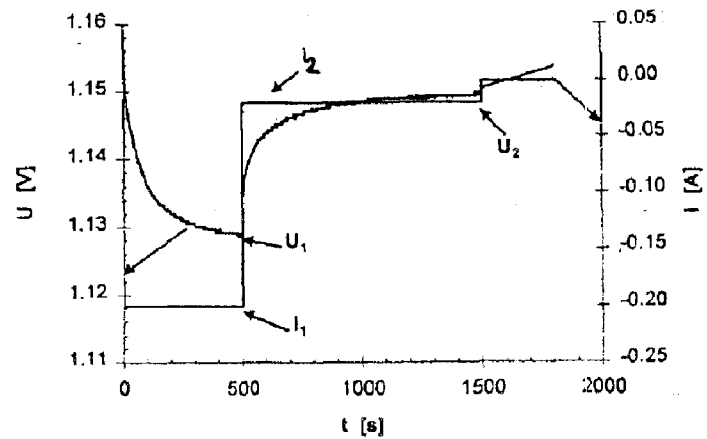
FIG. 5 shows a diagram of a galvanostatic double pulse with an associated voltage response for determining a resistance difference characteristic variable RD.

FIG. 5 shows a galvanostatic double pulse for determining the resistance difference characteristic variable. Instead of the previously described large number of individual current pulses in alternating current directions, a galvanic double pulse can also be used without the current direction being changed in order to determine the resistance difference characteristic variable.

Figure 6:
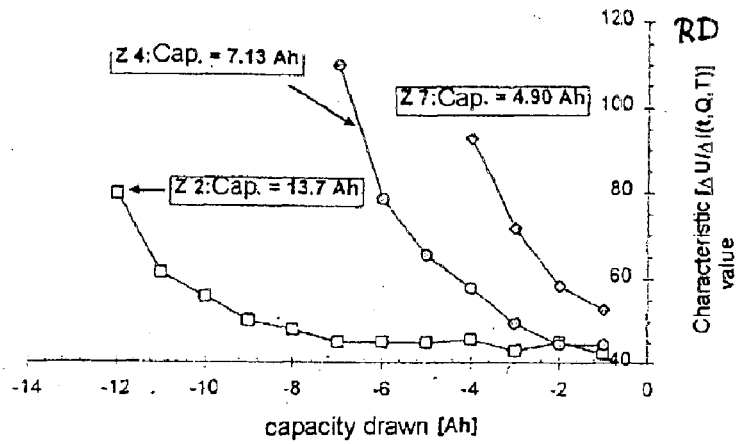
FIG. 6 shows a diagram of resistance difference characteristic variables RD as a function of the capacity drawn for energy storage batteries of different capacities, on the basis of different degrees of aging, for t=10 s.

FIG. 6 shows the relationship between the resistance difference characteristic variable RD and the capacity drawn from the investigated energy storage battery cells, with the second voltage value $U_2$ being measured 10 seconds after the application of the current pulse.

Figure 7:
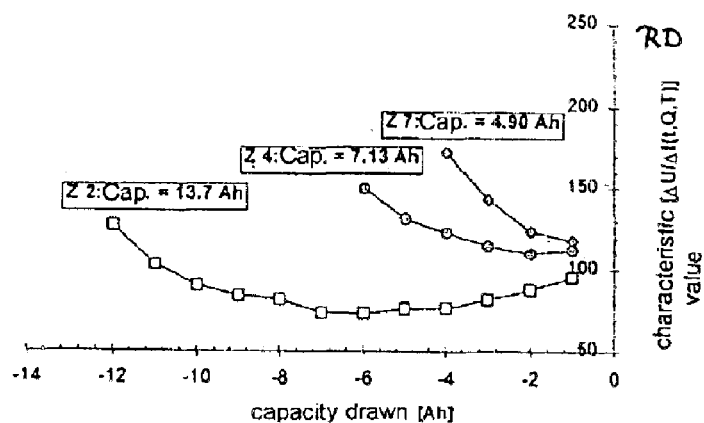
FIG. 7 shows a diagram of resistance difference characteristic variables RD as a function of the capacity drawn for storage batteries of different capacities on the basis of different degrees of aging, for t=1000 s.

In comparison to this, FIG. 7 shows the relationship between the resistance difference characteristic variable RD and the capacity that can be drawn, with the second voltage value $U_2$ being determined 1000 seconds after application of the current pulse.

This clearly shows that the resistance difference characteristic variable curve has a steeper profile at $t_2=10$ s than at $t_2=1000$ s. The amount of charge which can still be drawn from the energy storage battery can thus be determined more reliably for $t_2=10$ s than for longer time intervals.

A current profile I(t) is preferably applied by means of an electronic controller, with the current profile I(t) being intended to have largely square flanks. The current profile should be applied in operating phases in which the energy storage battery is not, or is only slightly, electrically loaded by other components. For starter batteries used in motor vehicles, the measurement should preferably be carried out in the parked phase, in which the rest current load in the discharge direction is in the range from about 10 to 100 mA.

The current may be applied by the controller itself. However, current loads or current sources may also be driven in such a manner as to produce the desired current profile for the energy storage battery. Alternatively, a further energy store can also be used as the current load or current source, with the direct-current pulse being injected via a DC/DC converter.

Figure 8:
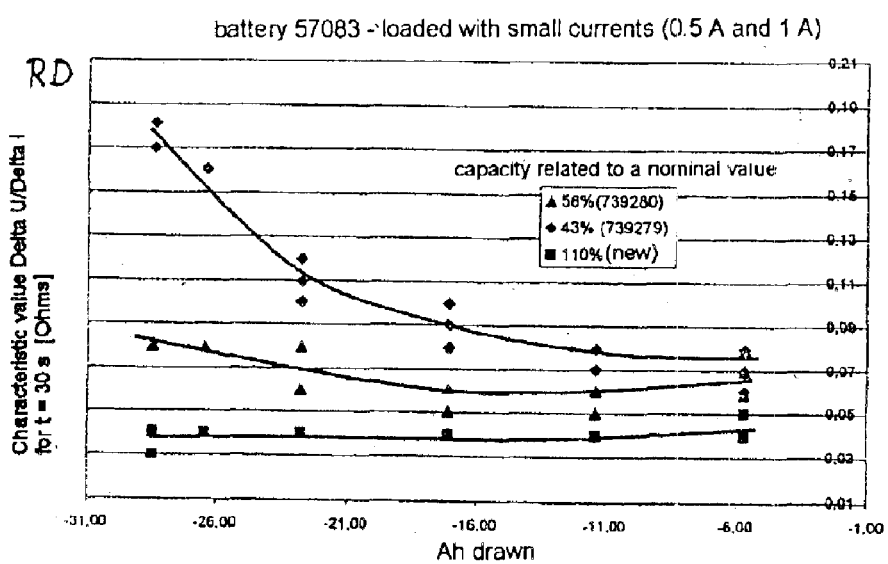
FIG. 8 shows a diagram of resistance difference characteristic variables RD as a function of the capacity drawn for energy storage batteries of different states of aging and with different capacities that can still be drawn, for t=30 s.

FIG. 8 shows the relationship between the resistance difference characteristic variables RD for starter batteries of different ages, with different capacities of 110% (represented by squares), 54% (represented by triangles) and 43% (represented by diamonds) that can still be drawn.

The resistance difference characteristic variables RD were calculated using voltage/current value pairs, with the second voltage value $U_2$ being measured 30 seconds after application of the current pulse.

It can clearly be seen that there is a relationship between the resistance difference characteristic variable RD and the capacity which can still be drawn. This means that the resistance difference characteristic variable RD is a measure of the amount of charge $Q_{Rest}$ which can be drawn from an energy storage battery in nominal conditions.

In order to obtain a resistance difference characteristic variable RD which can be evaluated reliably, voltage/current value pairs are preferably measured for a number of current pulses, with the difference quotients $$\left(\frac{\Delta U}{\Delta I}\right)_{ij} = \frac{\Delta U_{ij}}{\Delta I_{ij}}$$

being formed for each of them. The resistance difference characteristic variable RD is then formed from the set of difference quotients using, for example, suitable averaging methods, such as linear regression. The difference quotients may in this case be adapted as a function of the temperature T of the energy storage battery.

It is important to note that the construction and arrangement of the elements of the energy store as shown and described in the preferred and other exemplary embodiments is illustrative only. Although only a few embodiments of the present inventions have been described in detail in this disclosure, those skilled in the art who review this disclosure will readily appreciate that many modifications are possible without materially departing from the novel teachings and advantages of the subject matter recited herein. It should be noted that the elements and/or assemblies of the system may be constructed from any of a wide variety of materials that provide sufficient strength or durability. Other substitutions, modifications, changes and omissions may be made in the design, operating conditions and arrangement of the preferred and other exemplary embodiments without departing from the scope of the present invention.

What is claimed is:

1. A method for determining the amount of charge which can still be drawn from an energy storage battery comprising:
    measuring current values and voltage values at at least two times in a voltage response of the energy storage battery to at least one current pulse, with one voltage/current value pair being obtained for each of the at least two times;
    calculating a resistance difference characteristic variable utilizing the measured voltage/current value pairs; and
    determining of the amount of charge which can still be drawn from the energy storage battery utilizing the resistance difference characteristic variable.

2. The method of claim 1 wherein at least one of the times occurs in a phase whose voltage is not characterized by polarization, and at least one of the times occurs in a phase whose voltage is characterized by polarization.

3. The method of claim 1 wherein a first time is chosen before a current pulse with a front current pulse flank, and a second time is chosen after the front current pulse flank of the current pulse.

4. The method of claim 1 wherein the step of calculating the resistance difference characteristic variable includes:
    calculating current differences between two current values and voltage differences between two voltage values for a plurality of current pulses;
    calculating a set of difference quotients, wherein each difference quotient is the quotient of a voltage difference and its associated current difference; and
    calculating the resistance difference characteristic variable from the set of difference quotients.

5. The method of claim 4 wherein calculating the resistance difference characteristic variable comprises calculating a mean value of the set of difference quotients.

6. The method of claim 5 wherein the mean value is calculated utilizing linear averaging.

7. The method of claim 5 wherein the resistance difference characteristic variable is determined only from those voltage/current value pairs which are measured for comparable states of charge or comparable temperatures of the energy storage battery.

8. The method of claim 1 further comprising determining a change in capacity of the energy storage battery from at least one of the resistance difference characteristic variable and a change of the resistance difference characteristic variable.

9. The method of claim 1 further comprising determining the amount of charge which can still be drawn from the energy storage battery by means of at least one of a predetermined function and a stored value table for definition of the relationship between amounts of charge and resistance difference characteristic variables.

10. The method of claim 4 further comprising measuring the temperature of the energy storage battery and determining the amount of charge which can still be drawn from the energy storage battery as a function of the temperature.

11. The method of claim 10 further comprising normalizing the difference quotients with respect to a basic temperature.

12. The method of claim 1 further comprising determining the present degree of discharge of the energy storage, battery and determining the amount of charge which can still be drawn from the energy storage battery as a function of the degree of discharge.

13. The method of claim 1 further comprising applying at least one current pulse in one current direction to the energy storage battery.

14. The method of claim 1 further comprising applying a sequence of current pulses to the energy storage battery, with the current direction of the current pulses changing alternately.

15. The method of claim 1 wherein the magnitude of the current values is less than a 10-hour current of the energy storage battery.

16. The method of claim 15 wherein the magnitude of the current values is less than a 50-hour current of the energy storage battery.

17. The method of claim 15 wherein the magnitude of the current values is less than a 200-hour current of the energy storage battery.

18. The method of claim 1 wherein a current change takes place between two measurements of two voltage/current value pairs, with the magnitude of the current change being greater than a 5000-hour value of the current of the energy storage battery.

19. The method of claim 18 wherein the magnitude of the current change is greater than a 1000-hour value of the current of the energy storage battery.

20. The method of claim 18 wherein the magnitude of the current change is greater than a 200-hour value of the current of the energy storage battery.

21. The method of claim 18 wherein the current change takes place at a current rate of change whose magnitude is greater than the 5000-hour current of the energy storage battery per second.

22. The method of claim 19 wherein the current rate of change is greater than the 1000-hour current per second.

23. The method of claim 20 wherein the current rate of change is greater than the 200-hour cur rent per second.

24. The method of claim 1 wherein the resistance difference characteristic variable is determined only from those voltage/current value pairs whose first current voltage/current value pair at a first time was measured at most 10 seconds before a current change.

25. The method of claim 1 wherein the resistance difference characteristic variable is determined only from those voltage/current value pairs whose first current voltage/current value pair at a first time was measured at most 1 second before a current change.

26. The method of claim 1 wherein the resistance difference characteristic variable is determined only from those voltage/current value pairs whose first current voltage/current value pair at a first time was measured at most 0.1 second before a current change.

27. The method of claim 1 wherein the resistance difference characteristic variable is determined only from those voltage/current value pairs whose second current voltage/current value pair at a second time was measured at the earliest 0.1 second after the current change.

28. The method of claim 1 wherein the resistance difference characteristic variable is determined only from those voltage/current value pairs whose second current voltage/current value pair at a second time was measured at the earliest 1 second after the current change.

29. The method of claim 1 wherein the resistance difference characteristic variable is determined only from those voltage/current value pairs whose second current voltage/current value pair at a second time was measured at the earliest 10 seconds after the current change.

30. The method of claim 1 wherein the time intervals between the at least two times is temperature-dependent, with the time interval being greater for higher temperatures than for lower temperatures.

31. The method of claim 1 wherein the resistance difference characteristic variable is determined only from voltage/current value pairs which are measured at two times and for which the second voltage/current value pair was measured only when the time integral of the current flowing, starting from the time of a current change after the measurement of the first voltage/current value pair to the second time of the measurement of the second voltage/current value pair has a value of at least 0.01 mAs per ampere hour of storage capacity of the energy storage battery.

32. The method of claim 1 wherein the resistance difference characteristic variable is determined only from voltage/current value pairs which are measured at two times and for which the second voltage/current value pair was measured only when the time integral of the current flowing, starting from the time of a current change after, the measurement of the first voltage/current value pair to the second time of the measurement of the second voltage/current value pair has a value of at least 0.1 mAs per ampere hour of storage capacity of the energy storage battery.

33. The method of claim 1 wherein the resistance difference characteristic variable is determined only from voltage/current value pairs which are measured at two times and for which the second voltage/current value pair was measured only when the time integral of the current flowing, starting from the time of a current change after the measurement of the first voltage/current value pair to the second time of the measurement of the second voltage/current value pair has a value of at least 1 mAs per ampere hour of storage capacity of the energy storage battery.

34. The method of claim 18 further comprising utilizing an approximately standard current profile of the current pulses, with the current profile being determined from current rates of change of the current change between the voltage/current value pairs, the time period between a first voltage/current value pair and the current change, and the time period between the current change and the second voltage/current value pair.

35. The method of claim 1 wherein the current pulses are applied to the energy storage battery by means of an electrical switching unit.

36. The method of claim 1 further comprising comparing at least one of the resistance difference characteristic variable and the amount of charge which can be drawn with a threshold value.

37. The method of claim 36 further comprising outputting at least one of the overshooting of the threshold value, the ratio of the resistance difference characteristic variable or the amount of change which can be drawn from the storage battery to the threshold value, and the discrepancy between the resistance difference characteristic variable or the amount of charge which can be drawn from the storage battery and the threshold value.

38. The method of claim 36 wherein the threshold value is defined as a function of temperature of the energy storage battery.

39. The method of claim 1 further comprising determining at least one of the total present storage capacity of the energy storage battery and the amount of charge with which the energy storage battery can be charged by correlating the calculated amount of charge which can be drawn from the storage battery with at least one of a present degree of discharge and a present state of charge.

40. The method of claim 1 further comprising determining a wear characteristic variable in order to describe reduction in storage capacity of the energy storage battery by correlating the determined total present storage capacity of the energy storage battery with the storage capacity of the energy storage battery when new, or with the nominal value of the storage capacity of the energy storage battery when new.

41. The method of claim 40 further comprising comparing the wear characteristic variable with a threshold value and outputting a servicing message as a function of the comparison.

42. The method of claim 1 wherein the energy storage battery is a lead-acid rechargeable battery.

43. The method of claim 1 further comprising linking the resistance difference characteristic variable to a state variable for the energy storage battery.

44. The method of claim 43 wherein the state variable is selected from state of charge, power capability of the energy storage battery, and characteristic variables for effects which contribute to wear in an energy storage battery.

45. The method of claim 1 further comprising predicting the behavior of the energy storage battery in an operating state other than a present operating state.

46. An energy storage battery having measurement means and processor-controlled evaluation means configured to carry out a method comprising the steps of:

measuring current values and voltage values at at least two times in a voltage response of the energy storage battery to at least one current pulse, with one voltage/current value pair being obtained for each of the at least two times;

calculating a resistance difference characteristic variable utilizing the measured voltage/current value pairs; and determining of the amount of charge which can still be drawn from the energy storage battery utilizing the resistance difference characteristic variable.

* * * * *